United States Patent
Takaki et al.

[11] Patent Number: 5,846,612
[45] Date of Patent: Dec. 8, 1998

[54] PROCESS FOR FORMING HIGH-QUALITY DEPOSITED FILM UTILIZING PLASMA CVD

[75] Inventors: Satoshi Takaki, Komae; Atsushi Yamagami; Nobuyuki Okamura, both of Kawasaki, all of Japan

[73] Assignee: Canon Kabushiki Kaisha, Tokyo, Japan

[21] Appl. No.: 627,018

[22] Filed: Apr. 3, 1996

[30] Foreign Application Priority Data

Apr. 3, 1995 [JP] Japan ................................. 7-077810
Mar. 26, 1996 [JP] Japan ................................. 8-070106

[51] Int. Cl.$^6$ ........................... B05D 3/06; H05H 1/00
[52] U.S. Cl. .................... 427/569; 427/570; 427/573; 427/574; 427/578; 430/128
[58] Field of Search .................... 427/569, 570, 427/573, 574, 578, 255.5; 428/690, 917; 430/128

[56] References Cited

U.S. PATENT DOCUMENTS

| | | | |
|---|---|---|---|
| 4,619,729 | 10/1986 | Johncock et al. | 156/606 |
| 5,300,460 | 4/1994 | Collins et al. | 437/225 |
| 5,534,070 | 7/1996 | Okamura et al. | 118/723 E |
| 5,540,781 | 7/1996 | Yamagami et al. | 118/723 |

FOREIGN PATENT DOCUMENTS

| | | |
|---|---|---|
| 60-186849 | 9/1985 | Japan . |
| 61-283116 | 12/1986 | Japan . |
| 3-64466 | 3/1991 | Japan . |

OTHER PUBLICATIONS

H. Curtins et al., "Influence of Plasma Excitation Frequency for a–Si:H Thin Film Deposition", Plasma Chem. and Plasma Proc. vol. 7, No. 3 (1987). pp. 267–273.

*Primary Examiner*—Roy V. King
*Attorney, Agent, or Firm*—Fitzpatrick, Cella, Harper & Scinto

[57] ABSTRACT

Provided is a process for efficiently forming a high-quality deposited film at a high deposition rate in the quality equivalent to or higher than that of films formed by the RF plasma CVD process. A stock gas is introduced under a reduced pressure into a reaction container provided with a cathode electrode inside and a high-frequency power in the range of 50 to 300 MHz is supplied to the cathode electrode, whereby ions of the stock gas with energy of 40 or more eV are made to hit against a substrate, thereby forming a deposited film thereon.

21 Claims, 8 Drawing Sheets

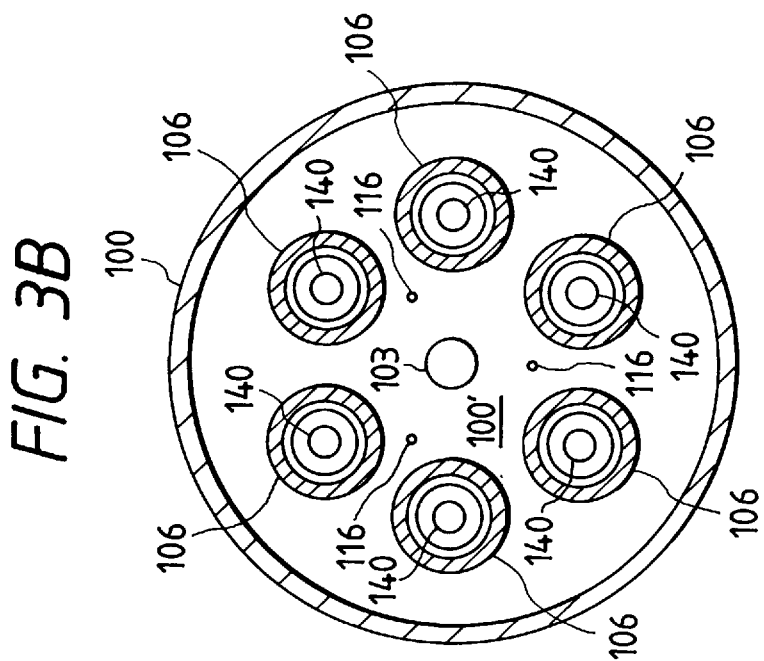
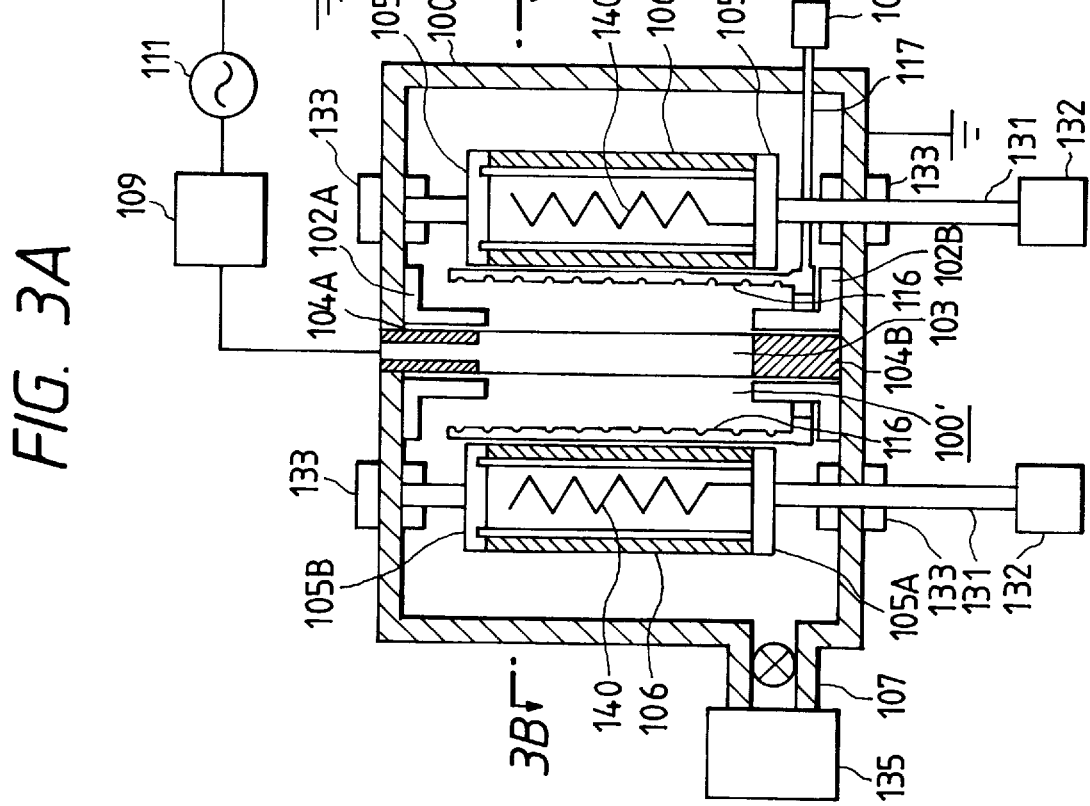

5,846,612

PROCESS FOR FORMING HIGH-QUALITY DEPOSITED FILM UTILIZING PLASMA CVD

BACKGROUND OF THE INVENTION

1. Field of the Invention

The present invention relates to a process for forming a deposited film utilizing plasma CVD that can form a high-quality deposited film which is either crystalline or non-monocrystalline including amorphous films at a high deposition rate. This process is useful to make semiconductor devices, line sensors for input of image, image pickup devices, photovoltaic devices, other various electronics devices, optical devices, and so on.

2. Related Background Art

The so-called RF plasma CVD process is frequently used in fabricating semiconductor devices. In the RF plasma CVD process the high-frequency wave of 13.56 MHz is usually used. The RF plasma CVD process has the advantages that control of discharge conditions is relatively easy and that the resulting film quality is excellent. The process has the problems that the utilization factor of gas is low and that the rate of forming deposited film is relatively small. Proposed in view of these problems in the RF plasma CVD process, is the microwave CVD process u sing the so-called microwave of the frequency of 2.45 GHz.

The microwave plasma CVD process can attain a higher film deposition rate at a higher utilization factor of gas as compared with the RF plasma CVD process. However, the film quality of a resulting film is not sufficiently satisfactory.

In recent years, the VHF plasma CVD process has been studied which uses a frequency in the so-called VHF (Very High Frequency) region between approximately 30 MHz and 150 MHz, higher than the frequency of RF (Radio Frequency), but lower than the frequency of microwave. Also in this frequency region, a larger film deposition rate can be attained at a higher utilization factor of gas as compared with the RF plasma CVD process. However, the quality of a resulting film is not satisfactorily uniform.

SUMMARY OF THE INVENTION

A main object of the present invention is to provide a process for forming a deposited film utilizing a plasma CVD process (hereinafter referred to as a "VHF plasma CVD process") using the high-frequency wave in the VHF region, capable of forming a high-quality deposited film at a high deposition rate on a surface of a deposition-target substrate and efficiently forming semiconductor devices.

Another object of the present invention is to provide a process for forming a deposited film which can form a large-area and high-quality film at a high deposition rate while minimizing defects due to attachment of dust or the like during film formation.

BRIEF DESCRIPTION OF THE DRAWINGS

FIGS. 3A and 3B are drawings to show an example of the plasma CVD apparatus used for carrying out the present invention, wherein FIG. 3A is a schematic sectional side view and FIG. 3B is a schematic sectional plan view along 3B—3B line in FIG. 3A;

DESCRIPTION OF THE PREFERRED EMBODIMENTS

As described above, the microwave CVD process has some advantages that cannot be achieved by the RF plasma CVD process. The microwave plasma CVD process can attain a much higher film deposition rate at an extremely high gas utilization factor. An example of the microwave CVD process is disclosed, for example, in Japanese Laid-Open Patent Application No. 60-186849 (hereinafter referred to as "Reference 1"). Reference 1 discloses the CVD process using a microwave plasma CVD apparatus having the configuration shown in FIG. 1.

Figure 1:
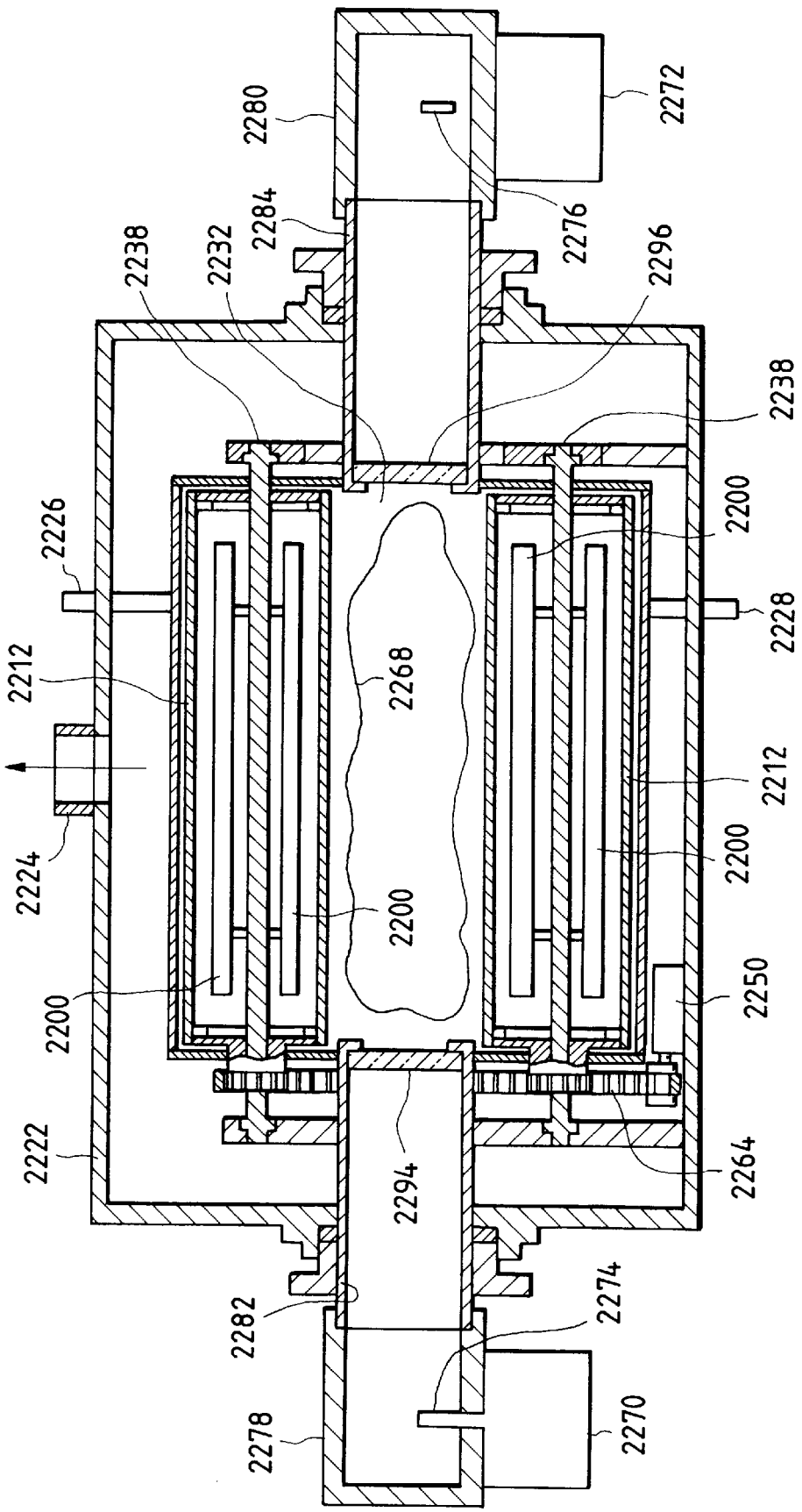
FIG. 1 is a schematic sectional view to show an example of the microwave plasma CVD apparatus.

Below explained is the microwave plasma CVD technology disclosed in Reference 1. In FIG. 1, a cylindrical substrate 2212 is rotatably set on each of a plurality of shafts 2238 arranged in parallel in a vacuum container (deposition chamber) 2222. The cylindrical substrates 2212 are rotated by power transmitted from a motor 2250 through a drive chain 2264. FIG. 1 shows only two cylindrical substrates, but actually six cylindrical substrates 2212 are arranged with a predetermined spacing between two adjacent substrates on a same circumference. Reference numeral 2232 designates an inside chamber (that is, a discharge space) formed as surrounded by the six cylindrical substrates 2212. Numeral 2268 denotes plasma occurring in the inside chamber 2232.

Numeral 2294 is a microwave transmitting window located at one end of the inside chamber 2232, which communicates through waveguide tubes 2282 and 2278 with a microwave power supply (magnetron) 2270. Numeral 2274 is an antenna probe extending from the microwave power supply 2270 into the waveguide tube 2278. Numeral 2296 is another microwave transmitting window located at the other end of the inside chamber 2232, which communicates through waveguide tubes 2284 and 2280 with a microwave power supply (magnetron) 2272.

Numeral 2276 is an antenna probe extending from the microwave power supply 2272 into the waveguide tube 2280. Microwave energy transmitted from each microwave power supply 2270, 2272 is transmitted through the antenna probe 2274 or 2276 to the waveguides (2278 and 2282 or 2280 and 2284) then to be guided through the microwave transmitting window 2294 or 2296 into the inside chamber 2232. In forming a deposited film by the microwave plasma CVD apparatus shown in FIG. 1, the inside of the vacuum container 2222 is evacuated through an exhaust port 2224 down to a desired pressure, and a stock gas is introduced through gas inlet pipes 2226 and 2228 into the inside chamber 2232.

Next, the microwave energy is supplied through the transmitting windows into the inside chamber 2232. Then the microwave energy decomposes the stock gas in the inside chamber 2232 to generate the plasma 2268, thereby effecting deposition of film on surfaces of the respective cylindrical substrates 2212 kept at a desired temperature by heaters 2200.

Reference 1 describes that deposited films can be formed at a high film-forming rate on the surfaces of the cylindrical substrates 2212 and the gas utilization factor is high, using the plasma CVD apparatus shown in FIG. 1.

In Reference 1, radio frequency energy is used for film formation of an upper photoconductive layer, requiring a high photoelectric characteristic. For actually performing photoelectric conversion, it is suggested that it may be difficult to stably perform formation of a high-quality deposited film at a high deposition rate. Further, since the microwave energy is supplied through the microwave transmitting windows 2294 and 2296 into the inside chamber 2232 and the stock gas is decomposed in the inside chamber 2232, film deposition unavoidably occurs on the microwave transmitting windows 2294 and 2296. There are cases where the films deposit on the microwave transmitting windows and lower efficiency of transmission of the microwave energy. Such films could peel off to mix into the deposited films formed on the cylindrical substrates, thereby making the deposited films defective. It is thus necessary to regularly remove the deposited films on the microwave transmitting windows, which is troublesome.

In addition to the microwave plasma CVD apparatus as described above, reference 1 also discloses a plasma CVD apparatus using a radio frequency energy (RF energy) source. The apparatus has the configuration shown in FIG. 2.

Figure 2:
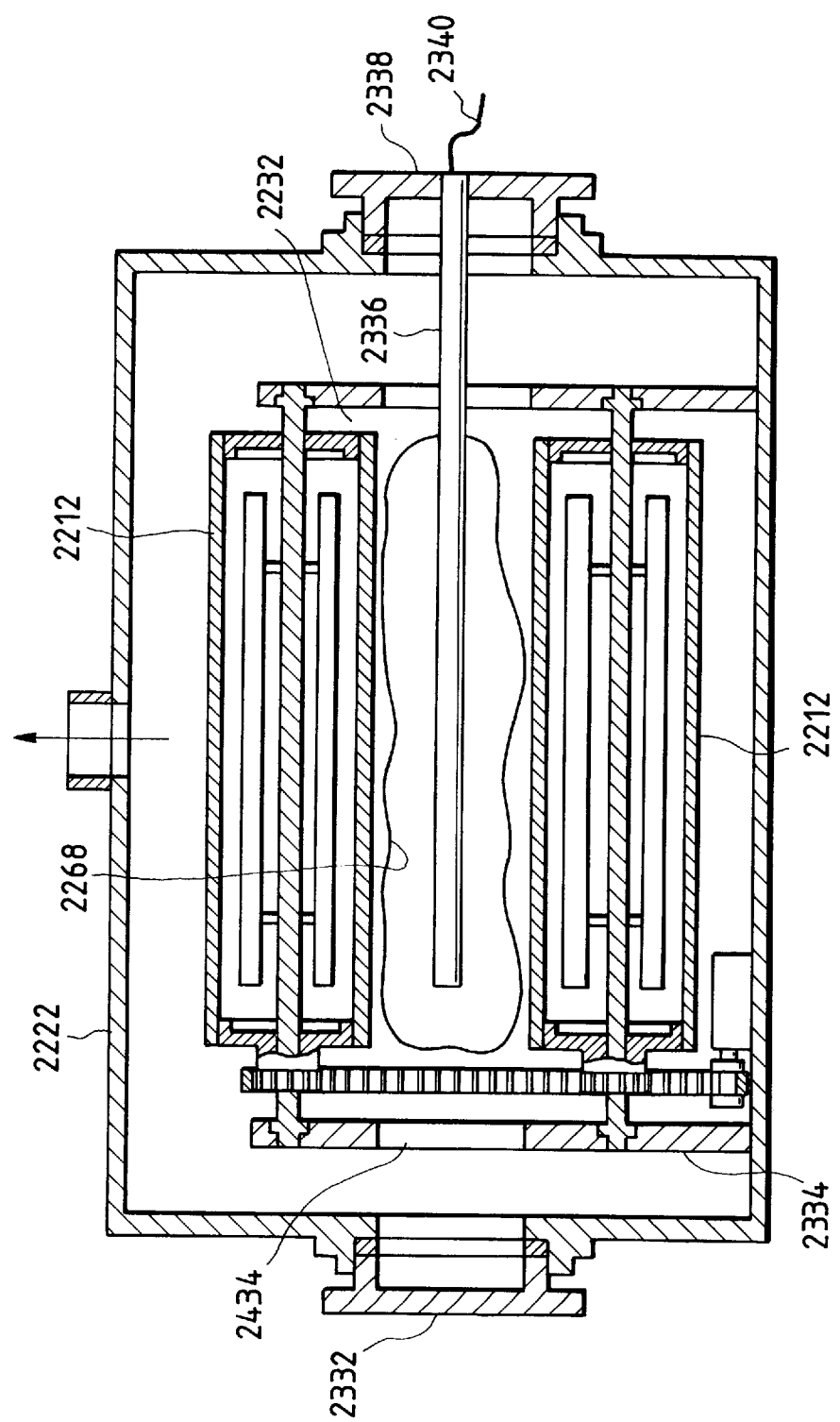
FIG. 2 is a schematic sectional view to show an example of the RF plasma CVD apparatus.

The apparatus shown in FIG. 2 has the configuration achieved by removing the microwave energy introducing means from the microwave CVD apparatus shown in FIG. 1 and adding an RF energy introducing means comprised of an antenna 2336 instead. In more detail, the apparatus of FIG. 2 is arranged in such a manner that the two microwave introducing means consisting of the microwave power supplies, waveguide tubes, and microwave transmitting windows are removed from the apparatus of FIG. 1, while a plate 2332 closes a hole at the setting place of the one microwave introducing means and the antenna extending into the inside chamber 2232 is placed at the setting place of the other microwave introducing means. Numeral 2434 is a plate for closing an aperture in an upright wall 2334 formed after removal of the waveguide tube 2282. The antenna 2236 is supported by an insulating plate 2338 and is connected to a lead wire 2340 connected to a radio frequency energy supply (not shown). The antenna 2336 and plate 2434 provide a combined means for guiding the radio frequency energy into the inside chamber 2232.

Reference 1 describes that the plasma 2268 can be formed in the inside chamber 2232 with the radio frequency energy, using the apparatus shown in FIG. 2. However, because the apparatus shown in FIG. 2 is arranged in the configuration in which the antenna 2336 and plate 2434 provide the combined means and the radio frequency energy is mainly supplied from the tip of the antenna 2336 into the inside chamber 2232, there are cases where nonuniform plasma is likely to be formed in the axial direction of the cylindrical substrates 2212. This makes it difficult to form uniform-quality and uniform-thickness deposited films on the cylindrical substrates.

Also, as described in Reference 1, the plasma excited by the radio frequency energy is not intended to perform high-speed deposition, but is used only for film deposition of the upper photoconductive layer requiring the film quality of higher performance, deposited after film deposition by the microwave glow-discharge plasma. Incidentally, Reference 1 describes the radio frequency energy, but includes no description about specific frequency.

Recent research on the plasma CVD process using an ultrashort wave in the VHF region is described in, for example, Plasma Chemistry and Plasma Processing, Vol. 7, No. 3, (1987), pp. 267 –273 (hereinafter referred to as "Reference 2"). Reference 2 describes that an amorphous silicon (a-Si) film is formed by using a capacitive coupled glow-discharge decomposing apparatus to decompose a stock gas (silane gas) by the ultrashort wave energy of the frequency 25 to 150 MHz.

Specifically, Reference 2 describes that a-Si films were formed as changing the frequency in the range of 25 MHz to 150 MHz, the maximum film deposition rate was 21 Å/sec in the use of 70 MHz, which was the forming rate approximately five to eight times greater than that by the above RF plasma CVD process, and defect density, optical band gap, and conductivity of the a-Si film obtained are rarely affected by the excitation frequency.

However, the film formation described in Reference 2 is of laboratory scale, but the reference does not discuss whether or not such effect can also be expected in formation of a large-area film. Further, Reference 2 includes no suggestion that simultaneous film formation is effected on a plurality of substrates to efficiently form large-area semiconductor devices is practically available. In this connection, Reference 2 simply suggests the potential that use of the high frequency wave (13.56 MHz to 200 MHz) has an interesting prospect of high-speed processing of a low-cost and large-area a-Si:H thin-film device demanded to have the thickness of some $\mu$m.

Japanese Laid-Open Patent Application No. 3-64466 (hereinafter referred to as "Reference 3") discloses a method for forming an amorphous silicon based semiconductor film on a cylindrical substrate, using the ultrashort wave energy of 20 or more MHz (preferably 30 MHz to 50 MHz). Specifically, the stock gas is introduced into the reaction chamber, the reaction chamber is set to the gas pressure of $10^{-4}$ to 0.2 Torr, and ultrashort wave energy is introduced into the reaction chamber in a quantity corresponding to 0.1 to 10 W/sccm as a ratio thereof to a flow rate of the stock gas to generate glow discharge, thereby forming the amorphous silicon based semiconductor film. It is described that the method of Reference 3 can achieve the film-forming rate 10 or more $\mu$m/hour and can decrease unevenness of film thickness of the deposited film to 20 or less %.

The inventors have conducted extensive studies in view of the references as described and accomplished the present invention. That is, the plasma CVD process of the present invention is a process for forming a deposited film which comprises introducing a stock gas under a reduced pressure into a reaction chamber provided with at least a cathode electrode inside thereof and applying a high-frequency power to the cathode electrode to form plasma of the stock gas, thereby forming a deposited film on a deposition-target substrate, wherein a frequency of the high-frequency power applied to the cathode electrode is set in the range of 50 MHz to 300 MHz and ions of the stock gas with energy of 40 or more eV are made to hit against the deposition-target substrate, thereby forming the deposited film thereon.

According to the deposited film forming process of the present invention, a high-quality deposited film can be formed at a high deposition rate on a film-forming substrate. The quality of the deposited film generally degrades as the deposition rate increases in film formation, but in the present invention the deposited film can be formed at the high deposition rate while maintaining the high quality desired.

In the present invention, it is preferable to set the pressure upon formation of the deposited film at 30 or less mTorr in order to make the ions with the energy of 40 or more eV hit against the deposition-target substrate.

Further, it is preferable that the energy of the stock gas ions hitting against the deposition-target substrate is 50 or more eV.

Further, it is preferable to set the film-forming pressure upon formation of the deposited film at 20 or less mTorr in order to make the stock gas ions with the energy of 50 or more eV hit against the deposition-target substrate.

In addition, it is preferable that an area of the cathode electrode is smaller than an area of the substrate serving effectively as an anode electrode against the cathode electrode.

Further, a plurality of cylindrical substrates may be arranged on a circumference with the cathode electrode at the center in the reaction chamber to form a discharge space in its central portion. The plasma is generated between the plurality of cylindrical substrates and the cathode electrode by supplying the high-frequency power to the cathode electrode while supplying the stock gas for film formation into the reaction chamber. A deposited film is formed on a surface of the each cylindrical substrate by rotating the cylindrical substrate around a cylinder axis thereof.

Further, it is preferable to supply the high-frequency power in the range of 0.3 W/cm$^2$ to 30 W/cm$^2$ per unit area of the cathode electrode and in the range of 0.01 W/cm$^3$ to 1 W/cm$^3$ per volume of the discharge space.

Further, the substrate is maintained preferably at the temperature of 60° C. to 400° C., and more preferably at the temperature of 100° C. to 350° C.

In addition, it is preferable that the deposited film is a deposited film of an amorphous substance containing at least one IV-group element, especially that the IV-group element is silicon.

Further, it is preferable to supply the high-frequency power in the range of 1 W/cc to 50 W/cc per supply amount of the stock gas containing silicon.

Further, the deposited film may preferably be used for an electrophotographic photosensitive member.

In addition, it is preferable to locate the cathode electrode at a position by a distance in the range of 20 mm to 200 mm apart from each of the substrates.

Further, it is preferable that the deposition rate is 30 or more Å/sec at the position where the deposition rate to the substrate is maximum.

The present inventors conducted the following experiments to achieve the above object of the present invention.

Experiment 1

The plasma CVD apparatus used in this experiment is shown in FIG. 3A and FIG. 3B. Using the plasma CVD apparatus shown in FIGS. 3A and 3B, an amorphous silicon film alone was prepared before producing an electrophotographic photosensitive member, and the electric characteristics and deposition rate thereof were checked. FIG. 3A is a schematic vertical section and FIG. 3B is a schematic cross section along 3B—3B line in FIG. 3A. In FIG. 3A and FIG. 3B, numeral 100 designates a reaction chamber. In the reaction chamber 100 there are six substrate holders 105A arranged at predetermined intervals on a circumference with a cathode electrode 103 described below at the center.

Numeral 106 denotes cylindrical substrates for film formation mounted on the respective substrate holders 105A. A heater 140 is provided inside each substrate holder 105A so as to be capable of heating the cylindrical substrate 106 from inside. Each substrate holder 105A is connected to a shaft 131 connected to a motor 132 so as to be rotated. Numeral 105B denotes auxiliary holding members for the cylindrical substrates 106.

Numeral 103 designates the cathode electrode for input of high-frequency power located at the center of a plasma occurring region. The cathode electrode 103 is connected through a matching circuit 109 comprised of an LC circuit to a high-frequency power supply 111. Further, 104A and 104B are insulating members and 102A and 102B are earth shields, which function to prevent abnormal discharge and local discharge at high-frequency introducing portions. Numeral 107 represents an exhaust pipe provided with an exhaust valve, and the exhaust pipe communicates with an exhaust mechanism 135 provided with a vacuum pump.

Numeral 108 is a stock gas supply system composed of a gas bomb, a mass flow controller, a valve, etc. The stock gas supply system 108 is connected through a gas supply pipe 117 to a gas release pipe 116 provided with a plurality of gas release ports. Numeral 133 stands for seal members.

In the present experiment six cylindrical substrates having the diameter 108 mm, the length 358 mm, the thickness 5 mm and made of Al, were set every film formation in the reaction chamber 100. With one out of the cylindrical substrates, disposed at positions opposed to the cathode electrode on the surface thereof were a glass substrate of Corning #7059 with a vapor deposited comb-shape electrode of the gap 250 μm made of Cr for evaluation of electric characteristics and a non-doped Si wafer for evaluation of infrared absorption characteristics. An a-Si:H film of about 1 μm thick was formed on each substrate while keeping the substrate stationary. The cathode electrode 103 used was a cylinder made of Al and having the diameter 40 mm, the length 400 mm, and the thickness 5 mm.

An object of this experiment is to check to which extent of the deposition rate the a-Si film with desired quality can be attained, as changing the deposition rate by controlling the frequency and power under the film-forming conditions shown in Table 1 and in the range of the high-frequency powers of the frequencies and powers shown in Table 2. Initially, the experiment was carried out under the pressure condition of about 0.2 Torr as shown in Reference 2, but generation of polysilane was extreme especially in the high high-frequency power region. Thus, the experiment was carried changing the pressure to 50 mTorr.

The inside of the reaction container 100 was first evacuated by actuating the exhaust mechanism 135, to control the pressure inside the reaction chamber at 100 to 1×10$^{-6}$ Torr. Next, the power was supplied to the heaters 140 to heat and maintain the cylindrical substrates 106 at the temperature of 250° C. Then film formation was conducted. Namely, SiH$_4$ gas was introduced at the flow rate of 500 sccm from the stock gas supply means 108 through the gas supply pipe 117 and gas release pipe 116 into the reaction container 100, thereby adjusting the pressure inside the reaction chamber to 50 mTorr. After this, the high-frequency wave was generated at the frequency between 13.56 MHz and 350 MHz as shown in Table 2 by the high-frequency power supply 111, and the high-frequency wave was supplied to the cathode electrode 103 through the matching circuit 109. Here, the high-frequency power supply 111 used was one that was able to give the frequency in the range as described above.

The matching circuit 109 was adequately adjusted depending upon the frequency of the high-frequency power supply. In this manner the amorphous silicon film was formed in the thickness of 1 μm on the evaluation substrate as described above, placed on the one cylindrical substrate 106.

TABLE 1

| SiH$_4$ | 500 sccm |
|---|---|
| Film formation pressure | 50 mTorr |
| Temperature of substrate | 250° C. |

TABLE 2

| Power-supply frequency (MHz) | 13.56 | 40 | 50 | 100 | 200 | 300 | 350 |
|---|---|---|---|---|---|---|---|
| Discharge power (W) | 250 | 250 | 250 | 250 | 250 | 250 | 250 |
| | 500 | 500 | 500 | 500 | 500 | 500 | 500 |
| | 1000 | 1000 | 1000 | 1000 | 1000 | 1000 | 1000 |
| | 2000 | 2000 | 2000 | 2000 | 2000 | 2000 | 2000 |

Each sample was evaluated mainly by photosensitivity defined as [(photoconductivity σp)/(dark conductivity (σd)]. Here, photoconductivity σp was evaluated as a conductivity under irradiation with He-Ne laser (wavelength 632.8 nm) having the intensity of 1 mW/cm$^2$. According to the inventors' knowledge heretofore from experiences in fabricating the electrophotographic photosensitive members, images valuable for practical use can be obtained by the electrophotographic photosensitive members produced as optimized based on the conditions by which the deposited film is obtained in such quality that the photosensitivity by the above method is $10^3$ or more. However, because of the recent tendency to seek higher image contrast, the photosensitivity of $10^4$ or more is becoming essential, and the photosensitivity of $10^5$ or more will be expected in near future. From this viewpoint, the values of photosensitivity were evaluated based on the following criteria.

⊚: Photosensitivity is $10^5$ or more, exhibiting very excellent film characteristics.

○: Photosensitivity is not less than $10^4$ but less than $10^5$, exhibiting good film characteristics.

Δ: Photosensitivity is not less than $10^3$ but less than $10^4$, exhibiting no problem in practical use.

×: Photosensitivity is less than $10^3$, which may be not suitable for practical use.

Table 3 shows evaluation results of photosensitivity and deposition rate.

TABLE 3

| Discharge power (W) | Power-supply frequency (MHz) | | | | | | |
|---|---|---|---|---|---|---|---|
| | 13.56 | 40 | 50 | 100 | 200 | 300 | 350 |
| 250 | ⊚ | ⊚ | ⊚ | ⊚ | ⊚ | ⊚ | * |
| | 5 | 9 | 11 | 20 | 22 | 14 | |
| 500 | ○ | ○ | ○ | Δ | Δ | ○ | * |
| | 10 | 16 | 21 | 37 | 40 | 27 | |
| 1000 | ○ | Δ | × | × | × | × | * |
| | 14 | 24 | 30 | 66 | 70 | 52 | |
| 2000 | Δ | × | × | × | × | × | * |
| | 20 | 29 | 36 | 93 | 100 | 79 | |

Upper rows indicate evaluation results of photosensitivity and lower rows indicate deposition rates (Å/s).

*: Discharge was intermittent, so that film formation was unsuccessful.

In each block in Table 3, an upper row indicates an evaluation result of photosensitivity and a lower row does the deposition rate. The deposited film having the photosensitivity of $10^4$ or more was attained at the deposition rate of 20 or more Å/s in the samples by the high-frequency energy having the frequency between 50 MHz and 300 MHz both inclusive; but the deposition film having the photosensitivity at the same level was not attained at the deposition rate of 30 or more Å/s. Further, all samples showed the photosensitivity less than $10^3$ at the deposition rate of 60 or more Å/s.

Experiment 2

In order to obtain a high-quality film at the high deposition rate of 30 or more Å/s, an external electric bias is given to form a deposited film as controlling the plasma potential to change the impact energy of ions of deposited species in the microwave CVD process, for example as described in Japanese Laid-Open Patent Application No. 61-283116. Then another experiment was carried out to form a deposited film as applying a dc bias voltage to the cathode electrode under the conditions in which the deposition rate of 30 or more Å/s was achieved in experiment 1.

The present experiment was carried out basically in the same manner as in experiment 1, using the plasma CVD apparatus shown in FIG. 3A and FIG. 3B. The apparatus in this experiment was different only in that, in order to apply the dc bias voltage to the cathode electrode, the circuit was branched in the matching circuit 109 and the branched terminal was connected through a low-pass filter (not shown) consisting of an LC circuit to a dc power supply (not shown). In the experiment a self-bias voltage of the cathode electrode was checked under each condition in which the deposition rate of 30 or more Å/s was attained in Table 2, and samples were produced in the same manner while in experiment 1 as applying the dc bias voltage of +50 V or +100 V relative to the self bias voltage to the cathode electrode. Evaluation of the samples were carried out mainly by photosensitivity in the same manner as in experiment 1.

In the present experiment, measurement of plasma potential by a Langmuir probe was also conducted in parallel in order to check the effect of application of the dc bias under the above film-forming conditions.

Table 4 shows results of photosensitivity, deposition rate, and plasma potential.

TABLE 4

| Discharge power (W) | Bias voltage (V) | Power-supply frequency (MHz) | | | |
|---|---|---|---|---|---|
| | | 50 | 100 | 200 | 300 |
| 500 | +50 | | ○<br>36<br>46 | ○<br>39<br>45 | |
| | +100 | | ⊙<br>35<br>62 | ⊙<br>37<br>57 | |
| 1000 | +50 | ○<br>31<br>45 | Δ<br>65<br>44 | Δ<br>69<br>43 | ○<br>52<br>42 |
| | +100 | ⊙<br>30<br>60 | ○<br>63<br>59 | ○<br>67<br>57 | ○<br>50<br>56 |
| 2000 | +50 | ○<br>35<br>42 | Δ<br>91<br>43 | Δ<br>98<br>42 | Δ<br>78<br>40 |
| | +100 | ⊙<br>34<br>58 | ○<br>90<br>57 | ○<br>96<br>56 | ○<br>76<br>54 |

Upper rows indicate evaluation results of photosensitivity, middle rows indicate deposition rates (Å/s), and lower rows indicate plasma potentials (V).

In each block in Table 4 an upper row indicates an evaluation result of photosensitivity, a middle row a deposition rate, and a lower row a plasma potential. From the results of Table 4, it is seen that application of the dc bias voltage rarely affects the deposition rate, but the sensitivity is greatly improved. It was also found that the plasma potential of 40 or more V was necessary for forming the deposited film with the photosensitivity of $10^4$ or more at the deposition rate of 30 or more Å/s, that the plasma potential of 50 or more V was necessary for forming the deposited film with the photosensitivity of $10^5$ or more at the same deposition rate, and that the plasma potential of 50 or more V was also necessary for forming the deposited film with the photosensitivity of $10^4$ or more at the deposition rate of 60 or more Å/s.

It was also found from the same measurement that the plasma potential was about 20 to 30 V under the condition in which the dc bias was not applied. It was also found that an average value of energy of ions hitting against the substrate was approximately equal to the plasma potential, from measurement of energy of stock gas ions hitting against the substrate by a Faraday cup.

Experiment 3

In the present experiment electrophotographic photosensitive members were produced under the conditions in which the results of the deposition rate of 30 or more Å/s and the photosensitivity of $10^4$ or more were achieved at either power-supply frequency between 50 MHz and 300 MHz in experiment 2; that is, the electrophotographic photosensitive members were produced by the high-frequency power of each frequency between 50 MHz and 300 MHz under the conditions of application of the high-frequency power 1 kW and the dc bias of +100 V relative to the original self-bias voltage.

Each electrophotographic photosensitive member was obtained by forming a charge injection inhibiting layer, a photoconductive layer, and a surface protection layer in this order on a cylindrical substrate made of Al, under the film-forming conditions shown in Table 5. Fabrication of the electrophotographic photosensitive member was carried out while rotating the substrate about the axis of the cylinder in order to form a photosensitive member over the entire surface of the cylindrical substrate. Because of this arrangement, an average deposition rate was about 1/3 to about 1/5 of the deposition rate at the position opposed to the cathode.

These samples were evaluated as to chargeability, sensitivity, and image defects. The results are shown in Table 6. Each sample had no extra problem as to the chargeability and sensitivity, but showed image defects. Therefore, on the whole, a sufficiently satisfactory electrophotographic photosensitive member could not be attained.

TABLE 5

| | | | |
|---|---|---|---|
| Surface protection layer | $SiH_4$ | 100 | sccm |
| | $H_2$ | 100 | sccm |
| | $CH_4$ | 500 | sccm |
| | input power | 800 | W |
| | reaction pressure | 50 | mTorr |
| | film thickness | 1 | μm |
| Photoconductive layer | $SiH_4$ | 400 | sccm |
| | $H_2$ | 400 | sccm |
| | input power | 1000 | W |
| | reaction pressure | 50 | mTorr |
| | film thickness | 25 | μm |
| Charge injection inhibiting layer | $SiH_4$ | 400 | sccm |
| | $H_2$ | 400 | sccm |
| | NO | 500 | sccm |
| | $B_2H_6$ | 2000 | ppm |
| | input power | 800 | W |
| | reaction pressure | 50 | mTorr |
| | film thickness | 1 | μm |

TABLE 6

| Power-supply frequency (MHz) | 50 | 100 | 200 | 300 |
|---|---|---|---|---|
| Chargeability | ⊙ | ⊙ | ⊙ | ⊙ |
| Sensitivity | ⊙ | ○ | ○ | ○ |

Consideration

From the results of research by the dc bias obtained in experiment 2 and experiment 3, which were:

(a) application of the dc bias improved the photosensitivity;

(b) a lot of image defects appeared in the electrophotographic photosensitive members produced under the conditions in which the dc bias was merely applied, the present inventors evaluated their causes.

The cause of the improvement in photosensitivity by application of the dc bias is presumed as follows from the measurement results with the Langmuir probe in experiment 2. The energy of ions hitting against the substrate increases with a rise of the plasma potential. As a result, energy that can readily change bonding states in the deposited film is given to the deposited film even at a high deposition rate. For example, the relatively high energy of hitting ions conceivably changes the bonding states in the film by changing chain —$SiH_2$— bonding and Si—$H_3$ bonding, which are considered to negatively affect the photosensitivity, into good Si—H bonding or by terminating dangling bonds with H. This can also be presumed from infrared absorption measurement of deposited film.

The cause of many image defects in the electrophotographic photosensitive members produced under the conditions in which the dc bias was applied is conceivably that dust existing in the discharge space is electrostatically adsorbed to be incorporated into the film by application of the dc bias upon film formation. In more detail, in producing the electrophotographic photosensitive member necessitating the film thickness of 20 to 30 μm, the film-forming step requires a long time, dust is emitted into the discharge space because of films peeling off from members other than the substrate, for example from the cathode electrode. The substrate holder, and so on, dust could reach the surface of the substrate, then the dc bias causes a dc voltage between the substrate and the dust, the dust is electrostatically adsorbed thereby, and the film is further deposited thereon, thus forming the image defects.

Based on the above considerations, it was found out that, in order to form an electrophotographic photosensitive member with high photosensitivity and without image defects even at a high deposition rate, it is preferable that the deposited film needed to be formed under such discharge conditions that the dc bias, which may have some relation with the image defects, was not applied and that the plasma potential of at least 40 V, more preferably 50 or more V, that is, the energy of ions hitting against the substrate, of at least 40 eV, more preferably 50 or more eV, was able to be attained.

Experiment 4

The present inventors extensively and intensively studied to find conditions to make the plasma potential 40 or more V and 50 or more V with the plasma excited by the high-frequency wave in the range of 50 to 300 MHz capable of obtaining the deposition rate of 30 or more Å/s without applying the dc bias to the cathode electrode, based on the above consideration. As a result, the inventors found out that the discharge pressure had a great influence on the plasma potential.

Figure 4:
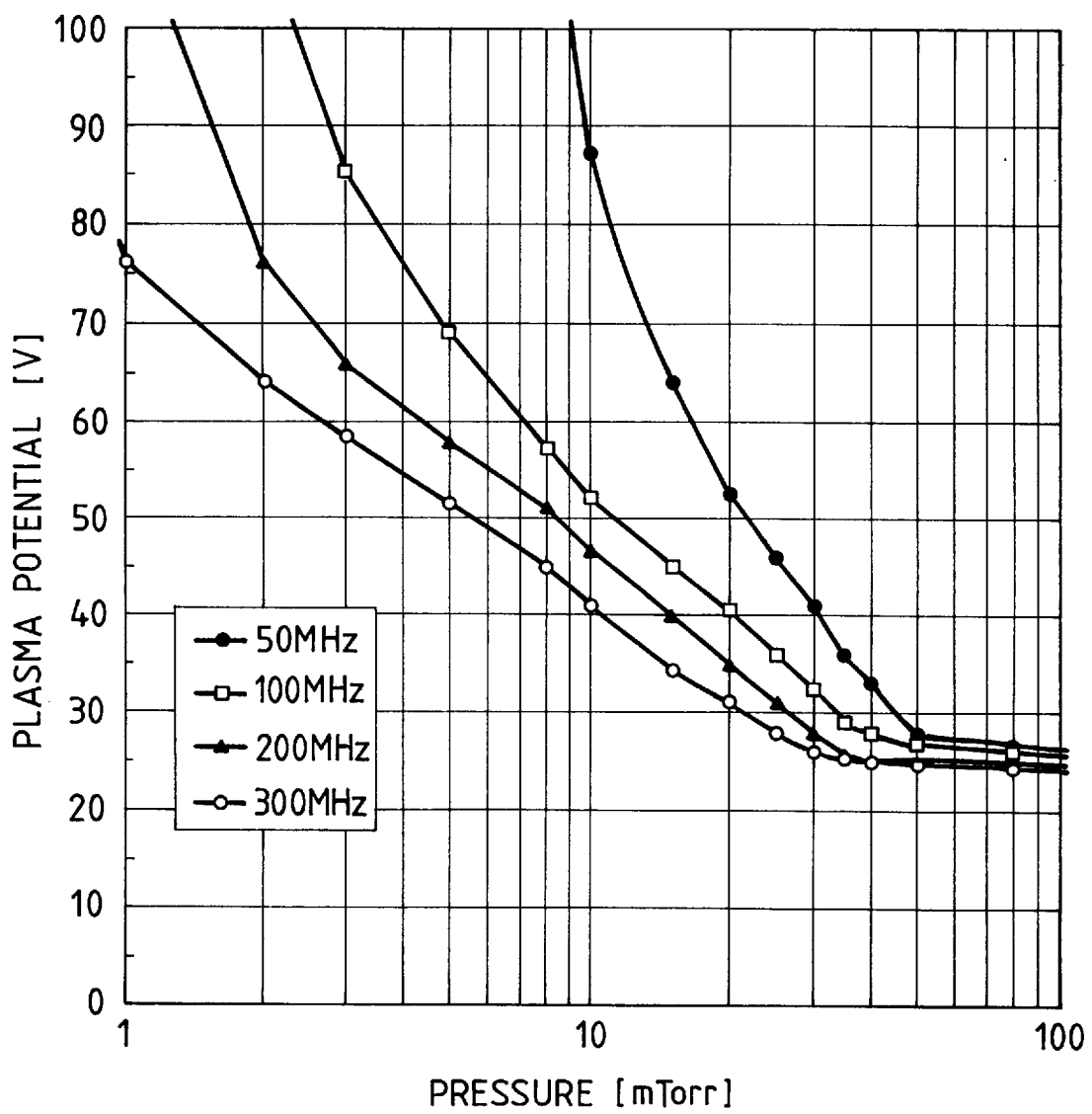
FIG. 4 is a graph to show an example of relation of plasma potential versus discharge pressure in the discharge space at each power-supply frequency.
Figure 5:
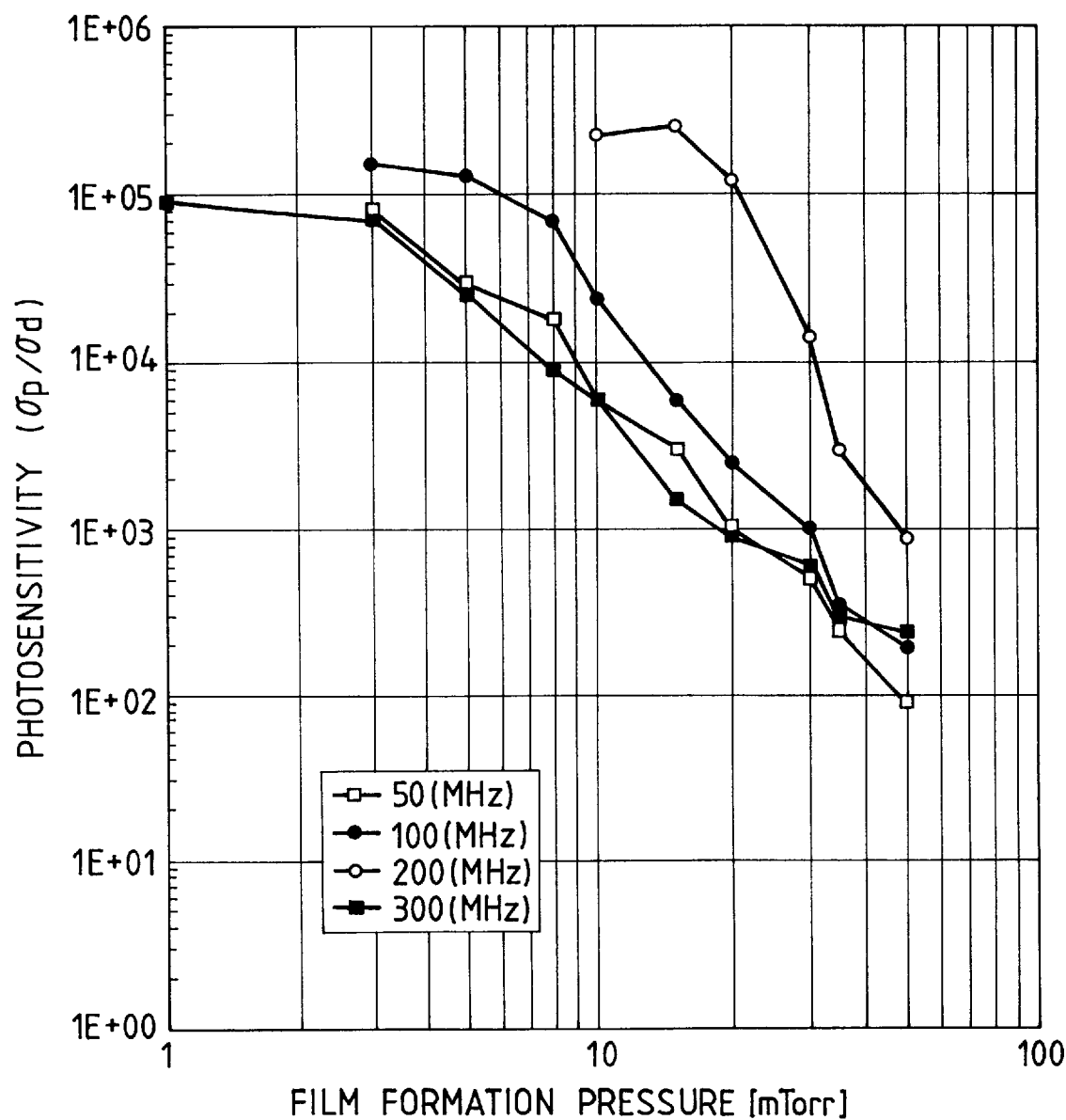
FIG. 5 is a graph to show an example of relation of photosensitivity of deposited film versus discharge pressure at each power-supply frequency.

FIG. 4 shows measurement results of a relationship between the plasma potential and the discharge pressure at the power-supply frequency between 50 and 300 MHz, at the high-frequency power 1 kW, and at the $SiH_4$ flow rate 400 sccm. From FIG. 4, at the power-supply frequency 50 MHz, the plasma potential is 40 or more V in the pressure range of about 30 or less mTorr. Similarly, the plasma potential is 40 or more V in the pressure range of about 20 or less mTorr at 100 MHz, in the pressure range of $P_{40}$ or less mTorr ($P_{40}$ is a value between 10 and 20) at 200 MHz, and in the pressure range of about 10 or less mtorr at 300 MHz. In the present experiment a relationship between film formation pressure and photosensitivity was further checked under the conditions of the high-frequency power 1 kW and the $SiH_4$ flow rate 400 sccm at each power-supply frequency in the range of 50 to 300 MHz, based on the measurement results of the plasma potential. The present experiment was carried out in the same technique as in experiment 1 except for changes of the film formation pressure, using the plasma CVD apparatus shown in FIG. 3A and FIG. 3B as in experiment 1. Results are shown in FIG. 5. From FIG. 5, it was confirmed that the deposited film with photosensitivity of approximately $10^4$ or more was able to be obtained under the condition that the plasma potential was +40 or more V at each frequency.

Experiment 5

Based on the results of experiment 4, that is, based on the conditions in which the photosensitivity of $10^4$ or more was attained in the above study at each power-supply frequency in the range of 50 to 300 MHz, electrophotographic photosensitive members were produced at the power-supply frequencies and under the pressure conditions in Table 7 and under the conditions shown in Table 8. Results are shown in Table 9. All electrophotographic photosensitive members showed good results as to the chargeability and sensitivity. The electrophotographic photosensitive members obtained with application of the dc bias in experiment 3 showed a lot of image defects, whereas those obtained in the present experiment showed good results without any image defects.

TABLE 7

| Power-supply frequency (MHz) | 50 | 100 | 200 | 300 |
|---|---|---|---|---|
| Film formation pressure (mTorr) | 20 | 10 | 8 | 5 |

TABLE 8

| | | |
|---|---|---|
| Surface protection layer | $SiH_4$ | 100 sccm |
| | $H_2$ | 100 sccm |
| | $CH_4$ | 500 sccm |
| | input power | 800 W |
| | film thickness | 1 μm |
| Photoconductive layer | $SiH_4$ | 400 sccm |
| | $H_2$ | 400 sccm |
| | input power | 1000 W |
| | film thickness | 25 μm |
| Charge injection inhibiting layer | $SiH_4$ | 400 sccm |
| | $H_2$ | 400 sccm |
| | NO | 500 sccm |
| | $B_2H_6$ | 2000 ppm |
| | input power | 800 W |
| | film thickness | 1 μm |

TABLE 9

| Power-supply frequency (MHz) | 50 | 100 | 200 | 300 |
|---|---|---|---|---|
| Chargeability | ◎ | ◎ | ◎ | ◎ |
| Sensitivity | ◎ | ○ | ○ | ○ |

Experiment 6

Figure 6:
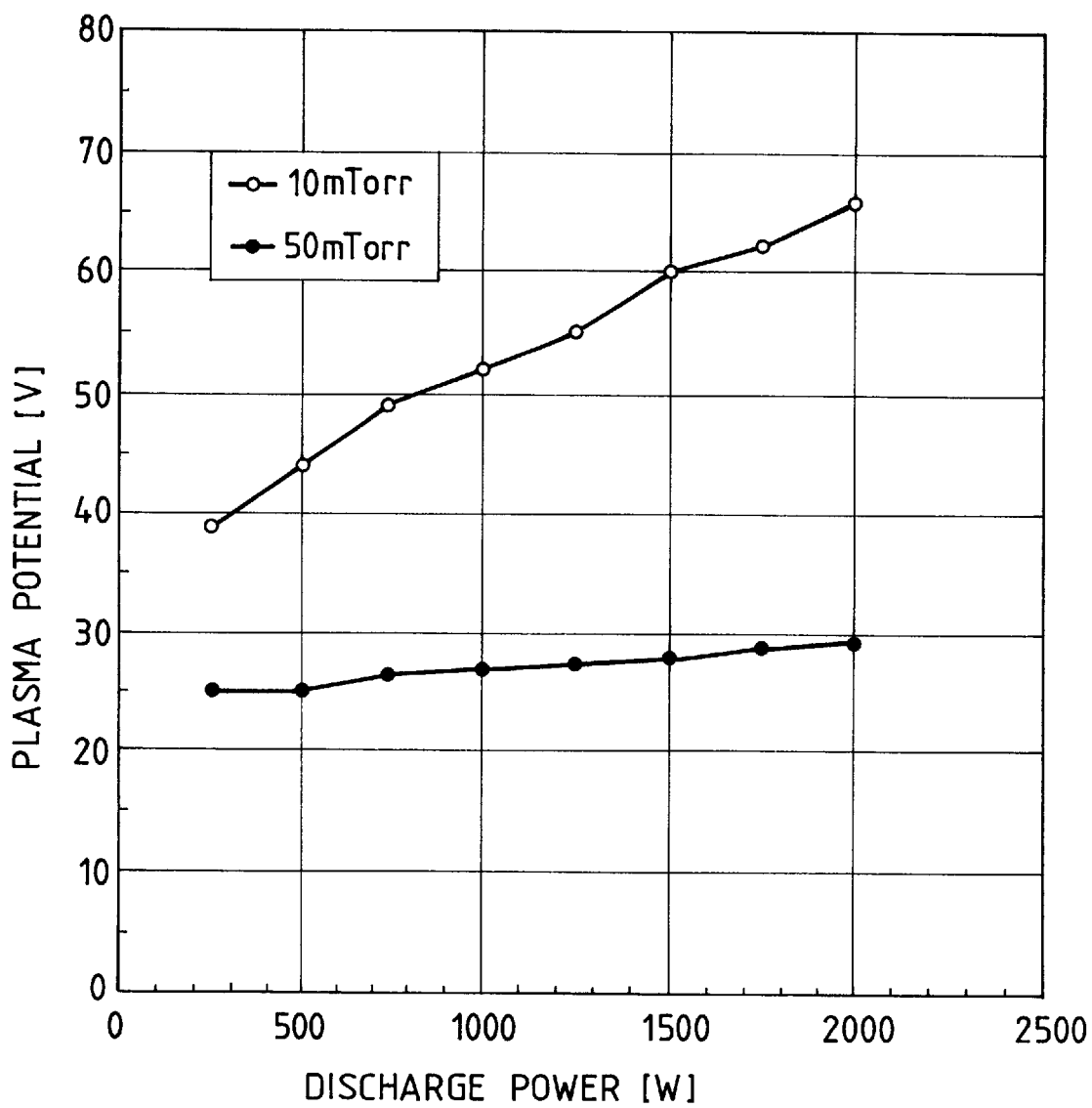
FIG. 6 is a graph to show an example of relation of plasma potential versus discharge power at the power-supply frequency of 100 MHz.
Figure 7:
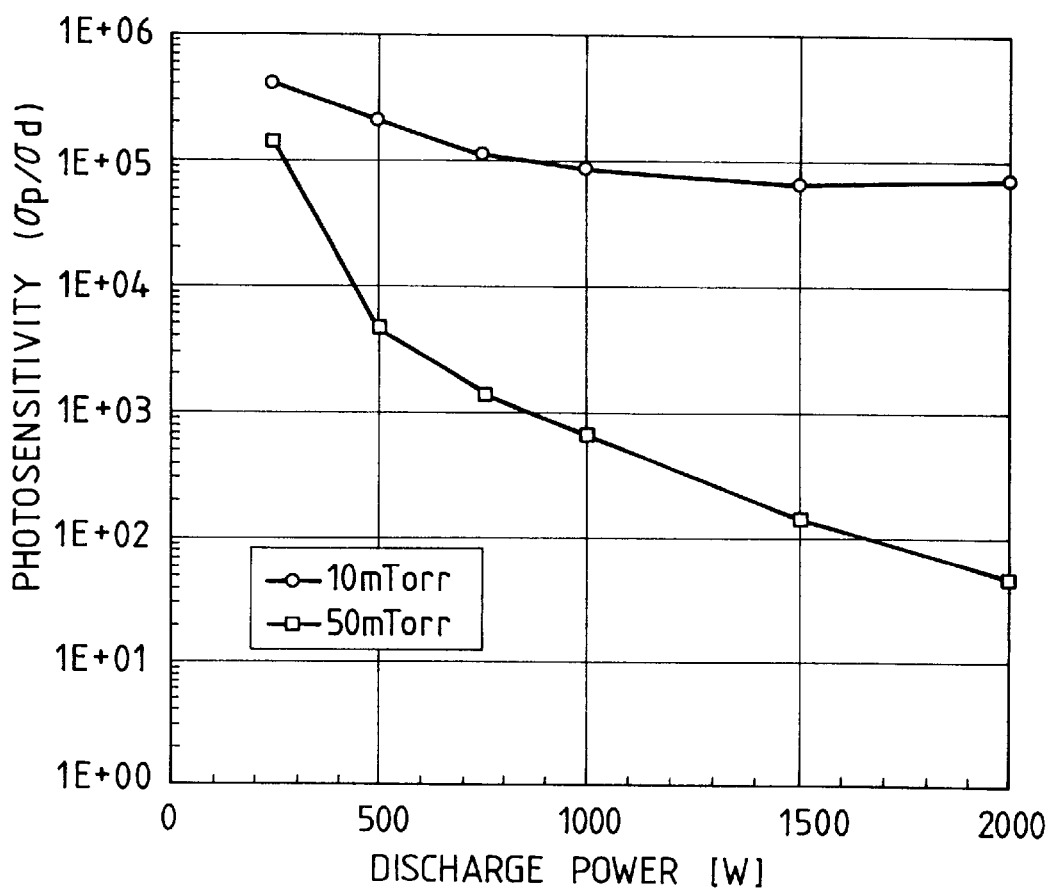
FIG. 7 is a graph to show an example of relation of photosensitivity versus discharge power at the power-supply frequency of 100 MHz.
Figure 8:
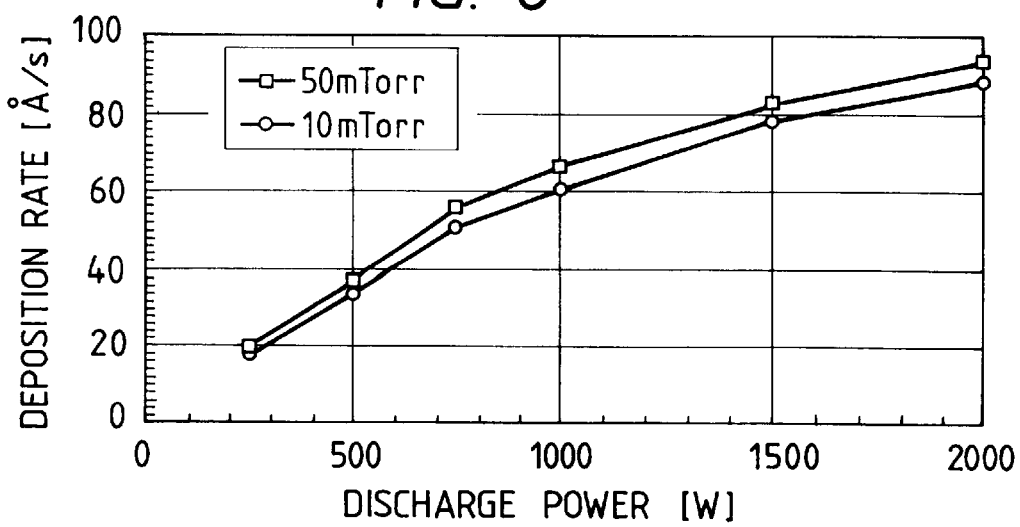
FIG. 8 is a graph to show an example of relation of deposition rate versus discharge power at the power-supply frequency of 100 MHz.

From experiment 4 and experiment 5, electrophotographic photosensitive members were obtained with excellent characteristics at a high deposition rate by optimizing the film formation pressure. The present experiment was carried out to check a relationship between plasma potential and discharge power under the discharge condition of the plasma potential being +40 or more V. As an example thereof, FIG. 6 shows measurement results of plasma potential and discharge power at the power-supply frequency 100 MHz, at the $SiH_4$ flow rate 400 sccm, and at the discharge pressures of 50 mTorr and 10 mTorr. At the discharge pressure 50 mTorr, the plasma potential shows little change near 30 V with changes of the power; but, at 10 mTorr the plasma potential increases with an increase of the power, specifically the plasma potential changes from below +40 V at 250 W to above +40 V at 500 or more W. FIGS. 7 and 8 show results of photosensitivity and deposition rate of the samples produced under the above conditions. The photosensitivity was $10^4$ or more even at the high-frequency power for achieving the deposition rate of 30 or more Å/s (about 400 W) under the pressure condition of 10 mTorr, but no sample showed good photosensitivity at the deposition rate of 30 or more Å/s under the pressure condition of 50 mTorr.

Experiment 7

The present experiment was conducted to check the temperature of substrate that permits the deposited film with good photosensitivity to be formed.

Film formation conditions

| | |
|---|---|
| SiH$_4$ flow rate | 400 sccm |
| Excitation frequency | 100 MHz |
| High-frequency power | 1 kW |
| Film formation pressure | 5 mTorr |
| Substrate temperature | 20 to 450° C. |

Figure 9:
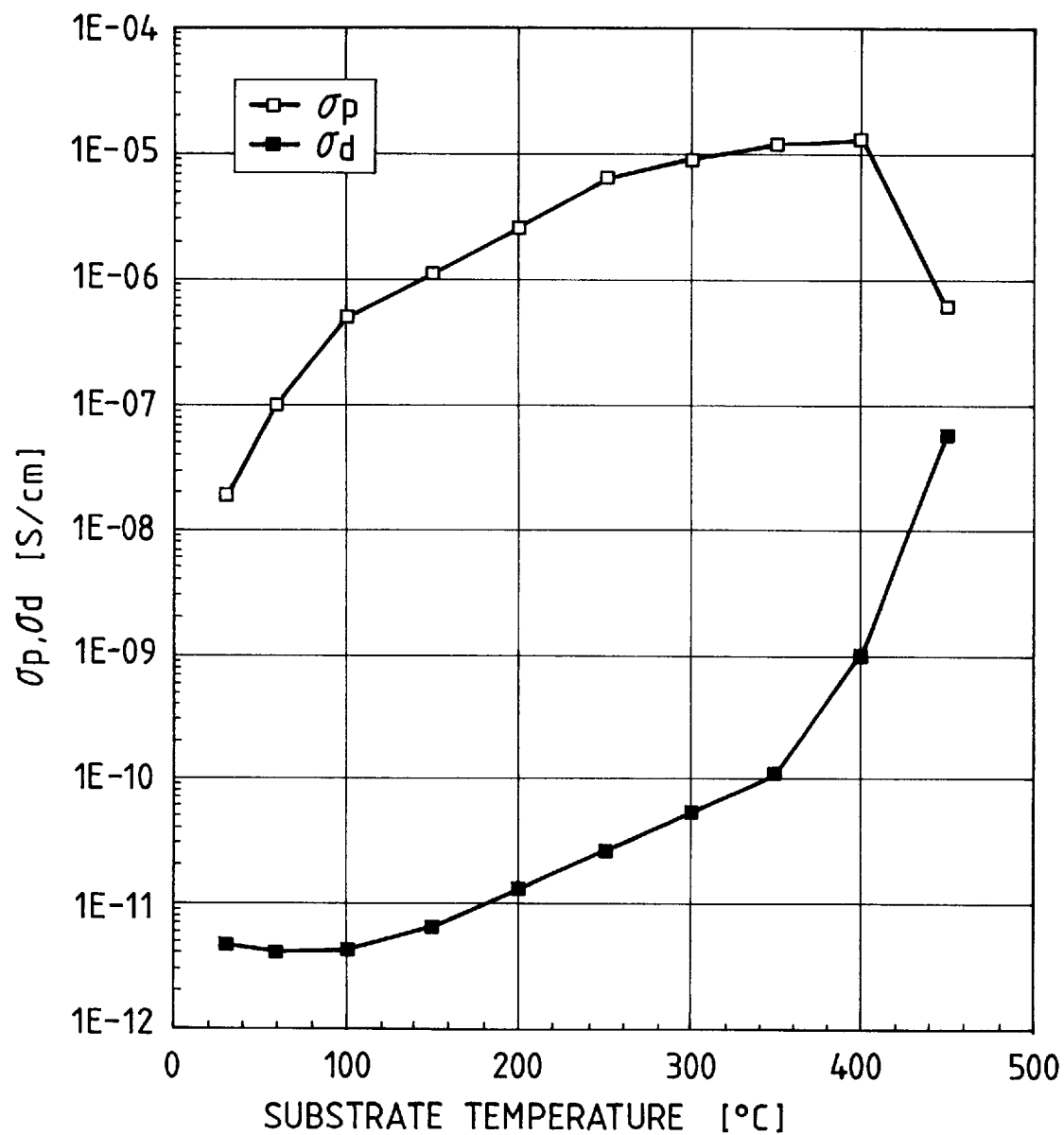
FIG. 9 is a graph to show an example of the relation of the photoconductivity and dark conductivity versus temperature of substrate at the power-supply frequency of 100 MHz.

FIG. 9 shows a relationship of photoconductivity and dark conductivity versus substrate temperature for the 1 μm thick deposited film obtained under the above film formation conditions. It is considered that a considerable amount of chain—(SiH$_2$)$_n$—bonding or Si-H$_3$ bonding still remains even with high energy of hitting ions at the substrate temperature of less than 60° C., and that fineness of the deposited film decreases to cause a drop of photoconductivity, thereby decreasing the photosensitivity to below 10$^4$. The reason why the photosensitivity drops below 10$^4$ at the substrate temperature above 400° C. is speculated as follows: hydrogen in the deposited film is eliminated upon film deposition to increase dangling bonds, the dark conductivity is increased by generation of hot carriers due to the dangling bonds, and the dangling bonds capture photoproduction carriers to decrease the photoconductivity, thereby decreasing the photosensitivity. The present experiment confirmed that the deposited film with the photosensitivity of 10$^4$ or more was able to be obtained at the substrate temperature between 60 and 400° C. and that the photosensitivity of 10$^5$ or more was able to be achieved at the substrate temperature between 100° C. and 350° C.

The present invention has been accomplished on the basis of the results of above experiment 1 to experiment 7.

Namely, the present invention introduces a stock gas under a reduced pressure into a reaction container provided with at least a cathode electrode inside thereof and applys a high-frequency power to the cathode electrode to form plasma of the stock gas, thereby forming a deposited film on a deposition-target substrate, wherein the frequency of the high-frequency power applied to the cathode electrode is set in the range of 50 MHz to 300 MHz and ions of the stock gas with the energy of 40 or more eV are made to hit against the deposition-target substrate to form the deposited film thereon.

The present invention can stably form the high-quality deposited film in the quality equivalent to or higher than that of the deposited films formed by the conventional RF plasma CVD process using the high-frequency energy of 13.56 MHz, at a high-deposition rate which is by no means inferior to the deposition rate attained by the microwave plasma CVD process.

In the present invention, a plurality of cylindrical substrates may be arranged on a circumference with the cathode electrode set in the reaction chamber being at the center to form a discharge space in the central portion, the plasma is generated between the plurality of cylindrical substrates and the cathode electrode by supplying the high-frequency power to the cathode electrode while supplying the stock gas for film formation into the reaction chamber. The cylindrical substrates may be rotated about their cylinder axis to form the deposited films on the surfaces of the cylindrical substrates, thereby efficiently forming the deposited films on the plural cylindrical substrates.

The present invention will be explained with reference to the drawings. The plasma CVD apparatus shown in FIG. 3A is an example of the plasma CVD apparatus suitable for carrying out the above plasma CVD process of the present invention. In FIG. 3A, reference numeral 100 designates a reaction chamber. Numeral 106 denotes cylindrical substrates for film formation located on associated substrate holders 105A, and six cylindrical substrates 106 are set on a circumference with the cathode electrode 103 described below being at the center of circle in the reaction chamber 100 so as to form a space (discharge space 100') in the central portion of the reaction chamber. A heater 140 is provided in each substrate holder 105A to the cylindrical substrate 106 from inside. Further, each substrate holder 105A is connected to a shaft 131 connected to a motor 132 to be rotated. Further, 105B stands for auxiliary holding members for cylindrical substrates 106. The cathode electrode 103 is positioned in the central portion of the discharge space 100' formed by the six cylindrical substrates 106 located on the circumference. The cathode electrode 103 is connected through a matching circuit 109 to a high-frequency power supply 111. Further, 104A, 104B are insulating members for insulating the cathode electrode 103 from the vacuum container 100. Earth shield 102A, 102B is positioned to cover an outer peripheral surface of each of the insulating members 104A and 104B. Numeral 107 denotes an exhaust pipe provided with an exhaust valve, and the exhaust pipe communicates with an exhaust mechanism 135 provided with a vacuum pump. Numeral 108 represents a stock gas supply system composed of a gas bomb, a mass flow controller, a valve, and so on. The stock gas supply system 108 is connected through a gas supply pipe 117 to a gas release pipe 116 provided with a plurality of gas release holes. Numeral 133 stands for seal members. The cathode electrode 103 is installed in the central portion of the discharge space surrounded by the plurality of cylindrical substrates, as described above. On this occasion, the cathode electrode 103 is desirably located at the position an equal distance apart from the plurality of cylindrical substrates 106. The number of cylindrical substrates arranged can be properly selected taking account of the volume of the reaction chamber, the diameter of the cylindrical substrates, the input power, etc., and preferably is 3 to 15. The distance between the cylindrical substrates 106 and the cathode electrode 103 is desirably determined in the range where uniform plasma can be generated in a desired state in the discharge space. Specifically, the distance is desirably in the range of 20 mm to 20 cm.

The process for forming a deposited film utilizing plasma CVD process of the present invention is carried out, for example using the plasma CVD apparatus shown in FIG. 3A. After the cylindrical substrates 106 are set on the substrate holders 105A, the exhaust mechanism 135 is actuated to evacuate inside the reaction chamber 100 and to reduce the pressure inside the reaction chamber 100 to a predetermined pressure. Then the power is supplied to the heaters 140 to heat the substrates 106 to a predetermined temperature and keep them at the temperature. Next, the stock gas is introduced from the stock gas supply system 108 through the gas supply pipe 117 and gas release pipe 116 into the reaction container 100 to adjust the pressure inside the reaction chamber to a desired pressure. After this, the high-frequency wave of the frequency 50 or more MHz is generated by the high-frequency power supply 111 and the high-frequency wave is supplied through the matching circuit 109 to the cathode electrode 103. Under the above conditions, in the discharge space 100' surrounded by the cylindrical substrates 106 and the cathode electrode 103 the stock gas is decomposed by the high-frequency energy to generate active species, thus forming deposited films on the cylindrical substrates 106. In this case, an electric bias of ±30 or less V may be applied to the cathode electrode 103, but it is preferred in general not to apply the bias.

In the present invention, in order to make the ions with the energy of 40 or more eV hit against the deposition-target substrate, the pressure upon formation of a deposited film is desirably set to 30 or less mTorr, particularly in the range of 0.1 to 30 mTorr.

In the present invention, it is desired in order to raise the rate of deposition or the quality of deposited film that the energy of the ions hitting against the deposition-target substrate be 50 or more eV, particularly in the range of 50 to 200 eV.

In order to make the ions with the energy of 50 or more eV hit against the deposition-target substrate, it is desired to set the film formation pressure upon formation of a deposited film at 20 or less mTorr, particularly in the range of 0.1 to 20 mTorr.

In the present invention, the frequency of the high-frequency power supply is preferably determined in the range of 50 MHz to 300 MHz.

In carrying out the process of the present invention, the gas used in film formation is properly selected from known stock gases, depending upon a type of a deposited film formed. For example, for forming an a—Si based deposited film, a preferred stock gas can be selected from silane, disilane, higher order silanes, or mixture gases thereof. For forming other deposited films, the stock gas may be selected, for example, from stock gases such as germane, methane, and ethylene, or mixture gases thereof. In either case, the stock gas for film formation may be introduced together with a carrier gas into the reaction container. The carrier gas may be hydrogen gas, or an inert gas such as argon gas or helium gas.

It is also possible to use a gas for improving the characteristics, for example a gas for adjusting the band gap of the deposited film. Such a gas may be selected, for example, from gases containing nitrogen atoms, such as nitrogen and ammonia; gases containing oxygen atoms, such as oxygen, nitrogen oxide, and dinitrogen oxide; hydrocarbon gases such as methane, ethane, ethylene, acetylene, and propane; gas fluorides such as silicon tetrafluoride, silicon hexafluoride, and germanium tetrafluoride; or mixture gases of these.

A dopant gas may be used for doping the deposited film formed. The doping gas may be selected, for example, from gas diborane, boron fluoride, phosphine, phosphorus fluoride, and so on.

In the present invention, the power supplied to the cathode electrode is one that can generate the plasma, that can maintain the plasma potential at +40 or more V, and that can maintain the deposition rate of 30 or more Å/s. For this, the power is desirably set at 0.3 W/cm$^2$ to 30 W/cm$^2$ per unit area of the cathode electrode and at 0.01 W/cm$^3$ to 1 W/cm$^3$ per volume of the discharge space. For forming an amorphous silicon based deposited film, the power is desirably determined at 1 W/cc to 50 W/cc per supply amount of the stock gas containing silicon.

The temperature of the substrate upon formation of a deposited film may be arbitrarily set, but, for forming the amorphous silicon based deposited film, the temperature is preferably determined in the range of 60° C. to 400° C., more preferably in the range of 100° C. to 350° C.

The present invention will be explained in further detail with specific examples, but it should be noted that the present invention is by no means limited to these examples.

EXAMPLE 1

Using the apparatus connected to the power supply of the frequency 50 MHz as the high-frequency power supply 111 in the apparatus shown in FIG. 3A, film formation was carried out under -the conditions shown in Table 1 in the same film-forming procedures as in experiment 4 described above to deposit an amorphous silicon film on each of six cylindrical substrates, thereby producing six electrophotographic photosensitive members at a time. The substrates 106 were Al cylindrical substrates having the diameter 108 mm and the length 358 mm.

The film formation was carried out as follows. Namely, after the six Al cylindrical substrates 106 were set each on the substrate holders 105A, the exhaust mechanism 135 was actuated to evacuate the inside of the reaction chamber 100 to adjust the pressure in the reaction chamber 100 to the pressure of $1 \times 10^{-6}$ Torr. Then the cylindrical substrates 106 were rotated and the power was supplied to the heaters 140 to heat the cylindrical substrates 106 each to the temperature of 250° C. and keep them at the temperature. Next, the stock gas was introduced under the conditions shown in Table 8 from the stock gas supply system 108 through the gas supply pipe 117 and gas release pipe 116 into the reaction chamber 100 to adjust the pressure inside the reaction chamber to the pressure of 30 mTorr. After this, the high-frequency energy of 50 MHz was generated by the high-frequency power supply 111, and the energy was supplied to the cathode electrode 103 to make the plasma in the discharge space 100'. The charge injection inhibiting layer, photoconductive layer, and surface protection layer were formed in this order in this manner, thus producing the electrophotographic photosensitive members.

During the film formation, a radiation state of the plasma was observed with the eye, which confirmed that the radiation of plasma was stable near the cylindrical substrates. The energy of the ions hitting against the substrates was 41 eV in the film-forming conditions of the photoconductive layers as photosensitive layers. Each of the six electrophotographic photosensitive members obtained was evaluated as to the chargeability and image density in the same manner as in experiment 3. As a result, all electrophotographic photosensitive members showed excellent results as to these evaluation items, as shown in Table 10. This confirmed that all electrophotographic photosensitive members were excellent in electrophotographic characteristics.

TABLE 10

| | Example 1 | Example 2 | Example 3 | Example 4 | Example 5 | Example 6 | Example 7 | Example 8 | Example 9 | Example 10 | Comparative example 1 | Comparative example 2 |
|---|---|---|---|---|---|---|---|---|---|---|---|---|
| Chargeability | ⊙ | ⊙ | ⊙ | ⊙ | ⊙ | ⊙ | ⊙ | ⊙ | ○ | ⊙ | x | ⊙ |

TABLE 10-continued

| | Example 1 | Example 2 | Example 3 | Example 4 | Example 5 | Example 6 | Example 7 | Example 8 | Example 9 | Example 10 | Comparative example 1 | Comparative example 2 |
|---|---|---|---|---|---|---|---|---|---|---|---|---|
| Sensitivity | ○ | ◎ | ○ | ◎ | ◎ | ◎ | ○ | ◎ | ○ | ◎ | x | ◎ |
| Image defects | ◎ | ◎ | ◎ | ◎ | ◎ | ◎ | ◎ | ◎ | ◎ | ◎ | — | x |

—: Not evaluated because the sample had no sufficient chargeability and no clear image was thus formed.

Comparative Example 1

Six electrophotographic photosensitive members were prepared in the same manner as in Example 1 except that the film formation pressure was 50 mTorr. The energy of the ions hitting against the substrates was 27 eV in the film-forming conditions of the photoconductive layers as photosensitive layers. Each of the electrophotographic photosensitive members obtained was evaluated in the same manner as in experiment 3. It was found that all electrophotographic photosensitive members were low in chargeability and sensitivity as shown in Table 10.

Comparative Example 2

Six electrophotographic photosensitive members were prepared in the same manner as in Example 1 except that the film-forming pressure was 50 mTorr and that the dc bias of +100 V relative to the self-bias voltage was applied to the cathode electrode. The energy of the ions hitting against the substrates was 65 eV. Each of the electrophotographic photosensitive members thus obtained was evaluated in the same manner as in experiment 3. As a result, it was found that all electrophotographic photosensitive members were excellent in both chargeability and sensitivity, but had a lot of image defects, as shown in Table 10.

EXAMPLE 2

Six electrophotographic photosensitive members were prepared in the same manner as in Example 1 except that the film-forming pressure was 20 mTorr. The energy of the ions hitting against the substrates was 53 eV in the film-forming conditions of the photoconductive layers as photosensitive layers. Each of the electrophotographic photosensitive members thus obtained was evaluated in the same manner as in experiment 3. As a result, all electrophotographic photosensitive members were also excellent in the all evaluation items and showed especially excellent results in sensitivity, as shown in Table 10. This confirmed that all electrophotographic photosensitive members were also excellent in the electrophotographic characteristics.

EXAMPLE 3

Six electrophotographic photosensitive members were prepared in the same manner as in Example 1 except that the frequency of the high-frequency power supply was 100 MHz and that the film-forming pressure was 10 mTorr. The energy of the ions hitting against the substrates was 52 eV in the film-forming conditions of the photosensitive layers. Each of the electrophotographic photosensitive members thus obtained was evaluated in the same manner as in experiment 3. As a result, all electrophotographic photosensitive members also showed excellent results as to the all evaluation items, as shown in Table 10. This confirmed that all electrophotographic photosensitive members were also excellent in the electrophotographic characteristics.

EXAMPLE 4

Six electrophotographic photosensitive members were prepared in the same manner as in Example 1 except that the frequency of the high-frequency power supply was 300 MHz and that the film-forming pressure was 3 mTorr. The energy of the ions hitting against the substrates was 58 eV in the film-forming conditions of the photosensitive layers. Each of the electrophotographic photosensitive members thus obtained was evaluated in the same manner as in experiment 1. As a result, all electrophotographic photosensitive members also showed excellent results as to all evaluation items, as shown in Table 10. This confirmed that all electrophotographic photosensitive members were also excellent in the electrophotographic characteristics.

EXAMPLE 5

The configuration of the apparatus shown in FIG. 3A and FIG. 3B was adjusted for the high-frequency power 500 W so that the power density against the area of the cathode electrode could be 0.3 W/cm$^2$ and so that the power density against the volume of the discharge space could be 0.01 W/cm$^3$, and six electrophotographic photosensitive members were prepared in the same manner as in Example 1 under the film-forming conditions of Table 11 at the substrate temperature 250° C., at the power-supply frequency 100 MHz, and at the high-frequency power 500 W. The power density per SiH$_4$ flow rate in the photosensitive layers this time was 1 W/cc. The energy of the ions hitting against the substrates was 56 eV in the film-forming conditions of the photosensitive layers. Each of the electrophotographic photosensitive members thus obtained was evaluated in same manner as in experiment 1. As a result, the all electrophotographic photosensitive members showed excellent results as to all evaluation items, as shown in Table 10. This confirmed that all electrophotographic photosensitive members were also excellent in the electrophotographic characteristics.

TABLE 11

| | | | |
|---|---|---|---|
| Surface protection layer | SiH$_4$ | 100 | sccm |
| | H$_2$ | 100 | sccm |
| | CH$_4$ | 500 | sccm |
| | input power | 500 | W |
| | film formation pressure | 5 | mTorr |
| | film thickness | 1 | μm |
| Photoconductive layer | SiH$_4$ | 500 | sccm |
| | H$_2$ | 500 | sccm |
| | film formation pressure | 5 | mTorr |
| | film thickness | 25 | μm |

TABLE 11-continued

| Charge injection inhibiting layer | SiH$_4$ | 400 sccm |
| --- | --- | --- |
| | H$_2$ | 400 sccm |
| | NO | 500 sccm |
| | B$_2$H$_6$ | 2000 ppm |
| | film formation pressure | 5 mTorr |
| | film thickness | 1 μm |

EXAMPLE 6

The configuration of the apparatus shown in FIG. 3A and FIG. 3B was adjusted for the high-frequency power 5 kW so that the power density against the area of the cathode electrode could be 30 W/cm$^2$ and so that the power density against the volume of the discharge space could be 1 W/cm$^3$, and six electrophotographic photosensitive members were prepared in the same manner as in Example 1 under the film-forming conditions of Table 12 at the substrate temperature 250° C., at the power-supply frequency 100 MHz, and at the high-frequency power 5 kW. The power density per SiH$_4$ flow rate in the photoconductive layers as photosensitive layers this time was 50 W/cc. The film-forming conditions of the photosensitive layers were determined at the minimum flow rate by which the deposition rate became 30 or more Å/s at the positions of the substrates opposed to the cathode electrode. Each of the electrophotographic photosensitive members obtained was evaluated in the same manner as in experiment 1. As a result, all electrophotographic photosensitive members showed excellent results as to the all evaluation items, as shown in Table 10. This confirmed that all electrophotographic photosensitive members were also excellent in the electrophotographic characteristics.

TABLE 12

| Surface protection layer | SiH$_4$ | 100 sccm |
| --- | --- | --- |
| | H$_2$ | 100 sccm |
| | CH$_4$ | 500 sccm |
| | film formation pressure | 5 mTorr |
| | film thickness | 1 μm |
| Photoconductive layer | SiH$_4$ | 100 sccm |
| | H$_2$ | 100 sccm |
| | film formation pressure | 5 mTorr |
| | film thickness | 25 μm |
| Charge injection inhibiting layer | SiH$_4$ | 100 sccm |
| | H$_2$ | 100 sccm |
| | NO | 125 sccm |
| | B$_2$H$_6$ | 2000 ppm |
| | film formation pressure | 5 mTorr |
| | film thickness | 1 μm |

EXAMPLE 7

Six electrophotographic photosensitive members were prepared in the same manner as in Example 3 except that the substrate temperature was 60°C. Each of the electrophotographic photosensitive members obtained was evaluated in the same manner as in experiment 3. As a result, all electrophotographic photosensitive members also showed excellent results as to all evaluation items, as shown in Table 10. This confirmed that all electrophotographic photosensitive members were also excellent in the electrophotographic characteristics.

EXAMPLE 8

Six electrophotographic photosensitive members were prepared in the same manner as in Example 3 except that the substrate temperature was 100° C. Each of the electrophotographic photosensitive members obtained was evaluated in the same manner as in experiment 3. As a result, all electrophotographic photosensitive members also showed excellent results as to all evaluation items, as shown in Table 10. This confirmed that all electrophotographic photosensitive members were also excellent in the electrophotographic characteristics.

EXAMPLE 9

Six electrophotographic photosensitive members were prepared in the same manner as in Example 3 except that the substrate temperature was 400°C. Each of the electrophotographic photosensitive members obtained was evaluated in the same manner as in experiment 3. As a result, the all electrophotographic photosensitive members also showed excellent results as to all evaluation items, as shown in Table 10. This confirmed that all electrophotographic photosensitive members were also excellent in the electrophotographic characteristics.

EXAMPLE 10

Six electrophotographic photosensitive members were prepared in the same manner as in Example 3 except that the substrate temperature was 350° C. Each of the electrophotographic photosensitive members obtained was evaluated in the same manner as in experiment 3. As a result, all electrophotographic photosensitive members also showed excellent results as to all evaluation items, as shown in Table 10. This confirmed that all electrophotographic photosensitive members were also excellent in the electrophotographic characteristics.

Since the present invention is constituted as explained above, the deposited film can be formed at the high deposition rate and in the high quality equivalent to that of the film formed by the conventional RF plasma CVD process using the high-frequency energy of 13.56 MHz. Accordingly, the present invention is effective to produce large-area and high-quality semiconductor devices at the higher deposition rate while minimizing defects due to attachment of dust during film formation. According to the present invention, large-area deposited films particularly excellent in the electrophotographic characteristics can be stably manufactured on a mass-production basis.

It is to be understood that the invention is not limited to the specific embodiments thereof and that various changes and modifications may be made in the invention without departing from the spirit and scope thereof.

What is claimed is:

1. A process for forming a deposited film containing at least one Group IVA element comprising introducing a stock gas under a reduced pressure into a reaction chamber provided with at least a cathode electrode inside thereof and applying a high-frequency power to said cathode electrode to form plasma of the stock gas, thereby forming a deposited film on a deposition-target substrate, wherein a frequency of the high-frequency power applied to said cathode electrode is set in the range of 50 MHz to 300 MHz and ions of the stock gas with energy of 40 or more eV are made to hit against said deposition-target substrate, thereby forming the deposited film thereon.

2. The process according to claim 1, wherein, in order to make the ions with the energy of 40 or more eV hit against said deposition-target substrate, a pressure upon forming the deposited film is set at 30 or less mTorr.

3. The process according to claim 1, wherein the energy of the ions of the stock gas hitting against said deposition-target substrate is 50 or more eV.

4. The process according to claim 3, wherein, in order to make the ions of the stock gas with energy of 50 or more eV hit against said deposition-target substrate, a film formation pressure upon forming the deposited film is set at 20 or less mTorr.

5. The process according to claim 2, wherein an area of said cathode electrode is smaller than an area of the deposition-target substrate serving effectively as an anode electrode against said cathode electrode.

6. The process according to claim 1, wherein said high-frequency power is supplied in the range of 0.3 W/cm$^2$ to 30 W/cm$^2$ per unit area of said cathode electrode and in the range of 0.01 W/cm$^3$ to 1 W/cm$^3$ per unit volume of said discharge space.

7. The process according to claim 1, wherein said substrate is kept at a temperature in the range of 60° C. to 400° C.

8. The process according to claim 1, wherein said substrate is kept at a temperature in the range of 100° C. to 350° C.

9. A process for forming a deposited film comprising introducing a stock gas under a reduced pressure into a reaction chamber provided with at least a cathode electrode inside thereof and applying a high-frequency power to said cathode electrode to form plasma of the stock gas, wherein a plurality of cylindrical substrates are arranged on a circumference with the cathode electrode set in said reaction chamber being located at the center to form a discharge space in a central portion thereof, the high-frequency power is supplied to said cathode electrode while supplying the stock gas for film formation into said reaction chamber, thereby generating the plasma between the plurality of cylindrical substrates and said cathode electrode, and the plurality of cylindrical substrates are rotated each around a cylinder axis thereof to form deposited films on the surfaces of the plurality of cylindrical substrates, and wherein the frequency of the high-frequency power applied to said cathode electrode is set in the range of 50 MHz to 300 MHz and ions of the stock gas with energy of 40 or more eV are made to hit against the plurality of cylindrical substrates, whereby the deposited films are formed thereon.

10. The process according to claim 1 or 9, wherein said deposited film is a deposited film of an amorphous substance containing at least one IVA-group element.

11. The process according to claim 10, wherein said IVA-group element is silicon.

12. The process according to claim 11, wherein said high-frequency power is supplied in the range of 1 W/cc to 50 W/cc per unit supply amount of the stock gas containing silicon.

13. The process according to claim 10, wherein said deposited film is for an electrophotographic photosensitive member.

14. The process according to claim 9, wherein said cathode electrode is located at a position by a distance in the range of 20 mm to 200 mm apart from each said substrate.

15. The process according to claim 1 or 9, wherein the deposition rate is 30 or more Å/sec at a position where the deposition rate onto said substrate reaches a maximum.

16. The process according to claim 9, wherein in order to make the ions with the energy of 40 or more eV hit against the plurality of cylindrical substrates, the pressure upon forming the deposited films is set at 30 or less mTorr.

17. The process according to claim 9, wherein the energy of the ions of the stock gas hitting against the plurality of cylindrical substrates is 50 or more eV.

18. The process according to claim 17, wherein to make the ions of the stock gas with energy of 50 eV or more hit against the plurality of cylindrical substrates, the pressure upon forming the deposited films is set at 20 or less mTorr.

19. The process according to claim 16, wherein the area of said cathode electrode is smaller than the area of each of the plurality of cylindrical substrates serving effectively as anode electrodes against said cathode electrode.

20. The process according to claim 11, wherein said deposited film is for an electrophotographic photosensitive member.

21. The process according to claim 12, wherein said deposited film is for an electrophotographic photosensitive member.

* * * * *

UNITED STATES PATENT AND TRADEMARK OFFICE
CERTIFICATE OF CORRECTION

PATENT NO. : 5,846,612

DATED : December 8, 1998

INVENTOR(S): SATOSHI TAKAKI, ET AL.

It is certified that error appears in the above-identified patent and that said Letters Patent is hereby corrected as shown below:

COLUMN 1

Line 26, "u sing" should read --using--.

COLUMN 2

Line 18, "substrate" should read --the substrate--.

COLUMN 4

Line 32, "is effected" should be deleted.

COLUMN 5

Line 34, "the each" should read --each--.

COLUMN 6

Line 53, "carried" should read --carried out--.

COLUMN 8

Line 17, "does" should be deleted.

UNITED STATES PATENT AND TRADEMARK OFFICE
CERTIFICATE OF CORRECTION

PATENT NO. : 5,846,612

DATED : December 8, 1998

INVENTOR(S): SATOSHI TAKAKI, ET AL.

It is certified that error appears in the above-identified patent and that said Letters Patent is hereby corrected as shown below:

COLUMN 11

Line 6, "electrode. The" should read --electrode, the--.
    Line 7, "on, dust" should --on. The dust--.
    Line 44, "mtorr" should read --mTorr--.

COLUMN 14

Line 9, "to" should read --to heat--.

COLUMN 16

Line 16, "-the" should read --the--.

COLUMN 17

Line 64, "the" should be deleted.

COLUMN 18

Line 48, "the" should be deleted.

UNITED STATES PATENT AND TRADEMARK OFFICE
CERTIFICATE OF CORRECTION

PATENT NO. : 5,846,612

DATED : December 8, 1998

INVENTOR(S) : SATOSHI TAKAKI, ET AL.

It is certified that error appears in the above-identified patent and that said Letters Patent is hereby corrected as shown below:

COLUMN 19

Line 30, "the" should be deleted.

COLUMN 20

Line 15, "the all" should read --the--.

Signed and Sealed this

Twenty-fourth Day of August, 1999

Attest:

Q. TODD DICKINSON

*Attesting Officer*      Acting Commissioner of Patents and Trademarks